United States Patent
Takatsuka et al.

(10) Patent No.: US 9,873,609 B2
(45) Date of Patent: Jan. 23, 2018

(54) POLYMER ACTUATOR ELEMENT

(71) Applicants: ALPS ELECTRIC CO., LTD., Tokyo (JP); National Institute of Advanced Industrial Science and Technology, Tokyo (JP)

(72) Inventors: Tomomasa Takatsuka, Miyagi-ken (JP); Isao Takahashi, Miyagi-ken (JP); Teppei Sugawara, Miyagi-ken (JP); Kenichi Mitsumori, Miyagi-ken (JP); Kinji Asaka, Miyagi-ken (JP); Takushi Sugino, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 314 days.

(21) Appl. No.: 14/752,496

(22) Filed: Jun. 26, 2015

(65) Prior Publication Data
US 2015/0298963 A1 Oct. 22, 2015

Related U.S. Application Data

(63) Continuation of application No. PCT/JP2013/085189, filed on Dec. 27, 2013.

(30) Foreign Application Priority Data

Dec. 27, 2012 (JP) ................. 2012-284032

(51) Int. Cl.
*H02N 11/00* (2006.01)
*B81B 3/00* (2006.01)
*F03G 7/00* (2006.01)

(52) U.S. Cl.
CPC ............ *B81B 3/0021* (2013.01); *F03G 7/005* (2013.01); *B81B 2201/032* (2013.01)

(58) Field of Classification Search
CPC .. B81B 3/0021; B81B 2201/032; F03G 7/005
USPC ......................................... 310/300
See application file for complete search history.

(56) References Cited

U.S. PATENT DOCUMENTS

| 8,253,308 | B2 * | 8/2012 | Ono .................. F03G 7/05 310/363 |
| 2005/0168113 | A1 | 8/2005 | Hirai et al. |
| 2013/0009514 | A1 * | 1/2013 | Asaka ............. B82Y 30/00 310/300 |
| 2013/0181572 | A1 | 7/2013 | Hino et al. |
| 2013/0307370 | A1 * | 11/2013 | Jenninger ........ H01L 41/113 310/300 |
| 2015/0202656 | A1 * | 7/2015 | Takahashi ....... H01L 41/0986 310/300 |

FOREIGN PATENT DOCUMENTS

| JP | 2005-163229 | 6/2005 |
| JP | 2011-114140 | 6/2011 |
| WO | WO 2010/029992 | 3/2010 |

OTHER PUBLICATIONS

Search Report dated Apr. 8, 2014 from International Application No. PCT/JP2013/085189.

* cited by examiner

*Primary Examiner* — Forrest M Phillips
(74) *Attorney, Agent, or Firm* — Beyer Law Group LLP

(57) ABSTRACT

A polymer actuator element includes an electrolyte layer and electrode layers, in which the electrode layer includes an activated carbon nanofiber and a carbon nanohorn.

6 Claims, 3 Drawing Sheets

POLYMER ACTUATOR ELEMENT

CLAIM OF PRIORITY

This application is a Continuation of International Application No. PCT/JP2013/085189 filed on Dec. 27, 2013, which claims benefit of Japanese Patent Application No. 2012-284032 filed on Dec. 27, 2012. The entire contents of each application noted above are hereby incorporated by reference.

BACKGROUND OF THE INVENTION

1. Field of the Invention

The present invention relates to a polymer actuator element including an electrolyte layer and an electrode layer.

2. Description of the Related Art

Pamphlet of International Publication No. WO2010/029992A1 discloses an invention relating to a polymer actuator element including an electrolyte layer and an electrode layer. Pamphlet of International Publication No. WO2010/029992A1 discloses that a carbon nanotube and a carbon nanohorn are included in an electrode layer in a predetermined ratio. Accordingly, Pamphlet of International Publication No. WO2010/029992A1 discloses that a great driving force and a great displacement amount can be generated.

However, the polymer actuator element including the electrolyte layer and the electrode layer requires excellent durability in addition to the basic characteristics of the displacement amount, the generating force, and the responsiveness.

However, in the related art, though a great displacement amount can be obtained, durability is not good. Particularly, when a DC voltage is continuously applied to an element, the time until the displacement amount is reduced by half from the maximum displacement amount is easily reduced, and satisfactory DC durability is not able to be obtained.

SUMMARY OF THE INVENTION

The invention provides a polymer actuator element that can maintain satisfactory durability and has a great displacement amount or a great generating force, and excellent responsiveness.

According to an aspect of the invention, there is provided a polymer actuator element including an electrolyte layer and electrode layers, in which the electrode layer includes an activated carbon nanofiber and a carbon nanohorn.

Accordingly, a polymer actuator element that maintains satisfactory durability (particularly, DC durability) and has a great displacement amount or a great generating force, and excellent responsiveness can be obtained.

According to the invention, it is preferable that the carbon nanofiber uses an aromatic mesophase pitch and is manufactured by a melt-spinning method. Accordingly, the durability can be enhanced more effectively.

Also, according to the invention, it is preferable that a weight of the carbon nanohorn is equal to or greater than a weight of the carbon nanofiber. Effectively, the displacement amount or the generating force can be caused to be great and the excellent responsiveness can be obtained. More specifically, it is preferable that a weight rate (carbon nanohorn content/total carbon content) of the carbon nanohorn to the total carbon content is in a range of 0.5 to 0.7. Accordingly, more effectively, the displacement amount or the generating force can be caused to be great, and the excellent responsiveness can be obtained.

Also, according to the invention, it is preferable that the electrolyte layer and the electrode layer include ionic liquid, and a weight rate (ionic liquid content (electrode layer)/total carbon content) of the ionic liquid to the total carbon content in the electrode layer is in the range of 1.3 to 1.7.

Also, according to the invention, it is preferable that the electrolyte layer and the electrode layer include a base polymer, and a weight rate (base polymer content (electrode layer)/total carbon content) of the base polymer to the total carbon content in the electrode layer is in the range of 0.7 to 1.1.

DESCRIPTION OF THE PREFERRED EMBODIMENTS

Figure 1:
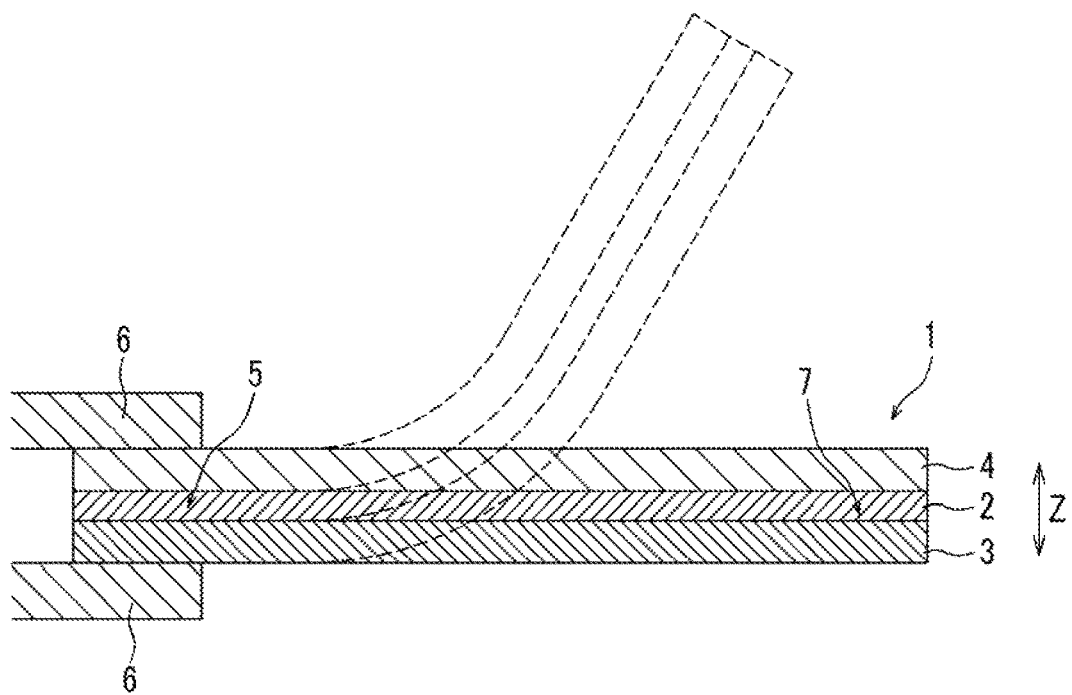
FIG. 1 is a sectional view illustrating a portion of a polymer actuator element according to an embodiment.

FIG. 1 is a sectional view illustrating a portion of a polymer actuator element according to the embodiment. With reference to FIG. 1, a structure of the polymer actuator element is described.

As illustrated in FIG. 1, a polymer actuator element 1 according to the embodiment includes an electrolyte layer (ion conductive layer) 2, and electrode layers 3 and 4 that are formed on both sides of the electrolyte layer 2 in the thickness direction (Z).

The polymer actuator element 1 according to the embodiment of the invention includes the electrolyte layer 2 having ionic liquid and a base polymer, and the electrode layers 3 and 4 that have activated carbon nanofiber (ACNF) and carbon nanohorn (CNH), ionic liquid, and a base polymer.

The electrolyte layer 2 is formed to have a thickness of about 10 μm to 30 μm. In addition, the total thickness obtained by adding thicknesses of an electrode layer 3 and an electrode layer 4 is about in the range of 50 μm to 150 μm.

As the base polymer, a polyvinylidene fluoride (PVdF)-based polymer, a polymethyl methacrylate (PMMA)-based polymer, or the like can be presented. Among them, particularly, a PVdF-based polymer is preferably used.

As the ionic liquid, ethylmethylimidazolium tetrafluoroborate (EMIBF4), ethylmethylimidazolium bis(trifluoromethanesulfonyl)imide (EMITFSI), ethylmethylimidazolium trifluoromethanesulfonate (EMITfO), or the like can be used.

A base end portion 5 of the polymer actuator element 1 is a fixed end portion, and the base end portion 5 of the polymer actuator element 1 is fixed to and supported by fixing and supporting portions 6. In the example illustrated in FIG. 1, the polymer actuator element 1 is supported on one side. Also, if a drive voltage is applied to a portion between the electrode layers 3 and 4 on both sides, as illustrated with dotted lines in FIG. 1, a volume difference is generated between the electrode layer 3 and the electrode layer 4 due to the ion movements or the like between the electrolyte layer 2 and the electrode layers 3 and 4, the bending stress occurs, and thus a front end portion 7 which is a free end portion of the polymer actuator element 1 can be curved and deformed. Generally, it is not considered that the principle in which the difference of the volume is generated between the electrodes due to the ion movement is unique, but as one of the representative causes of the principle, the difference of the volume is generated due to the difference of sizes of positive ions and negative ions.

According to the embodiment, the carbon materials included in the electrode layers 3 and 4 are activated carbon nanofibers (ACNF) and carbon nanohorns (CNH).

For example, the carbon nanofibers can be activated by an activation treatment (preferably, alkali activation treatment). As the activation treatment, a well-known method such as gas activation performed by using water vapor, chemical activation performed by using chemicals such as zinc chloride, and alkali activation performed by using an alkali metal compound can be used.

Particularly, according to the embodiment, the carbon nanofiber preferably uses pitch as a carbon precursor polymer. Particularly, among them, an aromatic mesophase pitch in which high strength and high elasticity are expected is preferably used. After melt-spinning a polymer blend obtained by dispersing aromatic mesophase pitch in a matrix polymer, an infusibilization treatment, a carbonization heating, an activation treatment, and a graphitization treatment are performed on the spun fiber, so that a carbon nanofiber can be manufactured. For example, a carbon nanofiber manufactured by Teijin Limited can be used.

In addition, in the electrode layers 3 and 4, a carbon nanohorn (CNH) is included as a conductivity adding material. In this manner, by including an activated carbon nanofiber (ACNF) and a carbon nanohorn in the electrode layers 3 and 4, the embodiment includes a carbon nanofiber in the electrode layer, but maintains the same durability as in a comparative example in which the carbon nanohorn is not included, and also obtains a greater displacement amount, a greater generating force, and more excellent responsiveness than the comparative example.

According to the embodiment, the weight of the carbon nanohorn is preferably equal to or greater than the weight of the carbon nanofiber. More specifically, the weight rate of the carbon nanohorn to the total carbon content (carbon nanohorn content/total carbon content) is preferably in the range of 0.5 to 0.7. The "total carbon content" is a value obtained by adding respective weights of the carbon nanohorn and the carbon nanofiber. However, if a carbon material other than the carbon nanohorn and the carbon nanofiber is included, the total carbon content is determined by adding weights of all carbon materials.

As illustrated above, by adjusting the weight rate of the carbon nanohorn to the total carbon content, as illustrated in the test below, the embodiment maintains the same durability as the comparative example in which the carbon nanofiber is included in the electrode layer but the carbon nanohorn is not included, and can effectively cause the displacement amount and the generating force to be great so that excellent responsiveness can be obtained compared with the comparative example.

With respect to the durability, when DC continuous driving is performed, time for which the displacement amount is reduced from the maximum displacement amount by half can be set to be an index. As the time of the reduction by half is longer, the great displacement amount can be maintained for a long time, so that the DC durability becomes great. With respect to the polymer actuator element according to the embodiment in which the activated carbon nanofiber and the carbon nanohorn are included in the electrode layers 3 and 4, the carbon nanofiber is included in the electrode layer, but the DC durability which is equal to or greater than that in the polymer actuator element of the comparative example that does not include a carbon nanohorn can be obtained.

In addition, according to the embodiment, the weight rate of the ionic liquid to the total carbon content in the electrode layers 3 and 4 (ionic liquid content (the electrode layers 3 and 4)/total carbon content) is preferably in the range of 1.3 to 1.7. Here, the ionic liquid content is evaluated by the weight of the ionic liquid included in the electrode layers 3 and 4. In addition, as the ionic liquid, EMI-TfO is preferably selected.

In addition, according to the embodiment, the weight rate of the base polymer to the total carbon content in the electrode layers 3 and 4 (base polymer content (the electrode layers 3 and 4)/total carbon content) is preferably in the range of 0.7 to 1.1. Here, the base polymer content is evaluated by the weight of the base polymer included in the electrode layers 3 and 4. In addition, at this point, as the base polymer, PVdF is preferably selected.

In this manner, by adjusting the ionic liquid content and the base polymer content to the total carbon content in the electrode layers 3 and 4, the displacement amount, the generating force, and the responsiveness can be stably enhanced. The polymer actuator element 1 is not limited to the three layer structure of the electrode layer 3/the electrolyte layer 2/the electrode layer 4 illustrated in FIG. 1.

In addition, in the manufacturing of the polymer actuator element, a method in the related art can be used. That is, the polymer actuator element can be manufactured by the preparation of the electrode liquid, the manufacturing of the electrode layer (casting method), the manufacturing of the electrolyte liquid, the manufacturing of the electrolyte layer (casting method), and the manufacturing of the polymer actuator element (stacking respective layers and thermocompression bonding).

EXAMPLE

Polymer actuators of the examples and the comparative example which have the three layer structure of the electrode layer/electrolyte layer/electrode layer illustrated in FIG. 1 were manufactured. In all of the examples and the comparative example, the electrode layers were formed of the carbon material, the ionic liquid, and the base polymer, and the electrolyte layers were formed of the ionic liquid and the base polymer. In addition, EMI-TfO was used in the ionic liquid, and PVdF was used in the base polymer. In addition, in all of the examples and the comparative example, the thickness of the elements is set to be about 100 μm.

In the polymer actuator element of the example, the activated carbon nanofiber (hereinafter, referred to as ACNF) and the carbon nanohorn (CNH) were used as the carbon material. In addition, in the polymer actuator elements of the comparative examples, ACNF was used as the carbon material. That is, in the polymer actuator element of the comparative examples, CNH was not included.

In Table 1 in the appendix, ionic liquid contents (mg), base polymer contents (BP content) (mg), ACNF contents (mg), CNH contents (mg), total carbon contents (mg), ionic liquid content/total carbon content, BP content/total carbon content, and CNH content/total carbon content of the comparative example and Examples 1 to 3 used in the test are presented. In addition, all of the ionic liquid content and the base polymer content refer to amounts in the electrode layer.

A drive voltage of 2.0 V was applied to the respective polymer actuator elements of the comparative example and Examples 1 to 3 having the weight of the respective components and the weight rates of the respective components to the total carbon content, as presented in Table 1, and displacement amounts, generating forces, and responsiveness were measured. The displacement amount was the maximum displacement amount at a position of 1 mm from the forefront end position of the polymer actuator element illustrated in FIG. 1 in the direction of the base end portion 5 (position of 4 mm from the most base end position in the direction of the front end portion 7). In addition, the generating force is indicated by a force when a drive voltage is applied to the polymer actuator element in the normal condition, which is illustrated with solid lines in FIG. 1 and the polymer actuator element is displaced. The responsiveness is a speed required for reaching the maximum displacement from the normal condition illustrated with solid lines in FIG. 1.

In Table 1, measurement results of the displacement amounts, the generating forces, and the responsiveness of the respective polymer actuator elements of the comparative example and Examples 1 to 3 were presented. In addition, based on Table 1, the displacement amounts of the respective specimens are illustrated in FIG. 2A, the generating forces of the respective specimens are illustrated in FIG. 2B, and the responsiveness of the respective specimens are illustrated in FIG. 2C, as graphs.

Figure 2A:
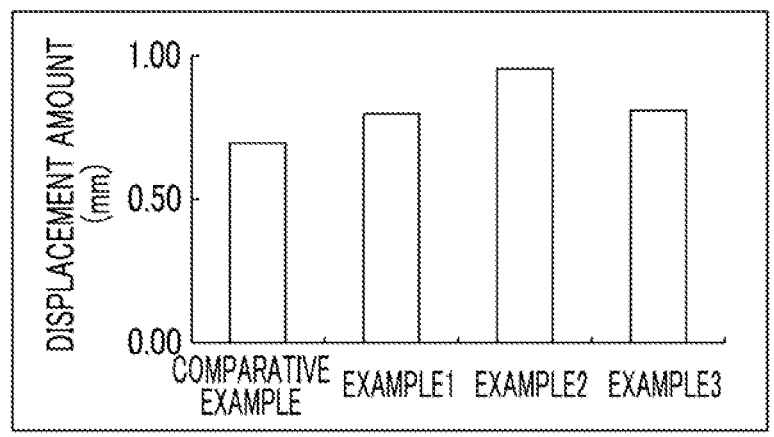
FIG. 2A is a graph illustrating test results of displacement amounts of a comparative example and Examples 1 to 3.
Figure 2B:
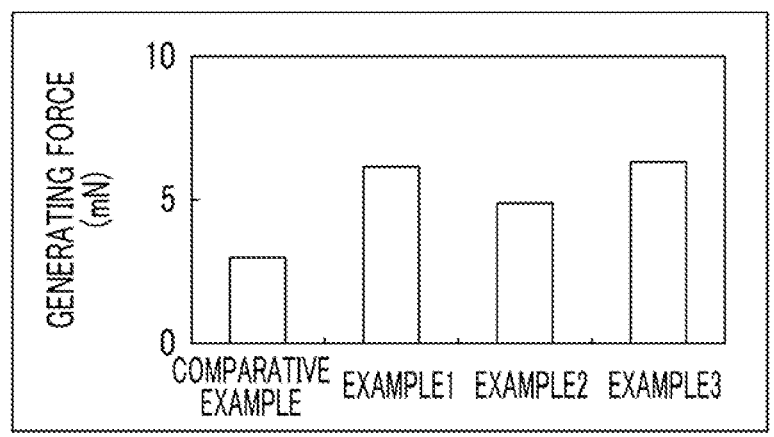
FIG. 2B is a graph illustrating test results of generating forces of the comparative example and Examples 1 to 3.
Figure 2C:
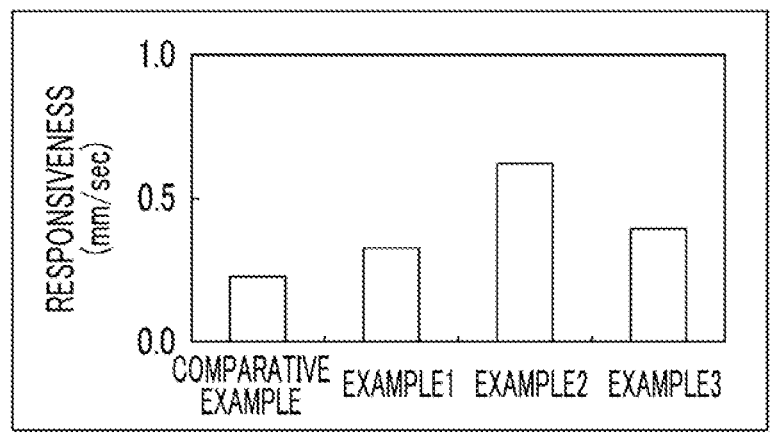
FIG. 2C is a graph illustrating test results of responsiveness of the comparative example and Examples 1 to 3.

As illustrated in Table 1 and FIGS. 2A to 2C, in all the polymer actuator elements of the respective examples, it was found that the displacement amounts and the generating forces were increased and the responsiveness was satisfactory, compared with the polymer actuator element of the comparative example.

In all the examples, the CNH content was set to be equal to or greater than the ACNF content. In addition, in the examples, the CNH content/total carbon content was set to be in the range of 0.5 to 0.7, the ionic liquid content (electrode layer)/total carbon content was set to be in the range of 1.3 to 1.7, and the BP content (electrode layer)/total carbon content was set to be in the range of 0.7 to 1.1.

Subsequently, in the same condition as Example 2, Example 4 was manufactured.

In the test, a voltage was applied to a portion between electrode layers of the respective polymer actuator element of Example 4 and the comparative example (same specimen used in Table 1) (2.0 V AC 50 mHz), and the displacement amounts, the generating forces, and the responsiveness were measured. The test results are presented in Table 2 in the appendix.

In addition, as described above, Example 4 was manufactured in the same condition as Example 2, but, due to the manufacturing irregularity, the thickness of the elements in Example 4 is thinner than that in Example 2, and as a result, the displacement amount in Example 4 is greater than in Example 2, and the generating force in Example 4 is smaller than in Example 2.

Figure 3:
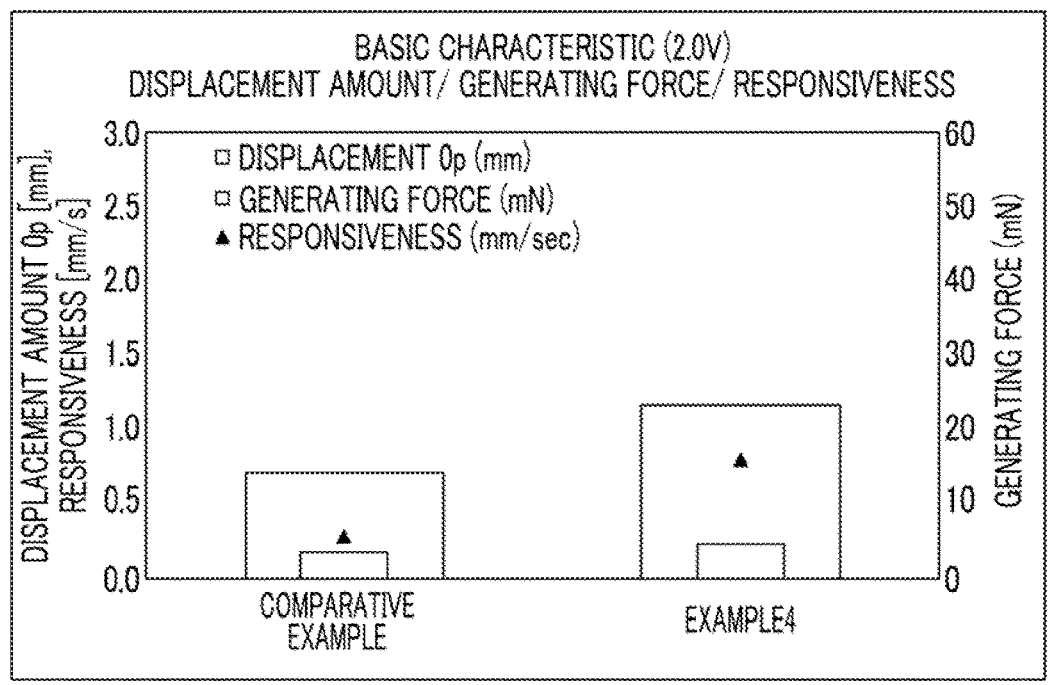
FIG. 3 is a graph illustrating test results of displacement amounts, generating forces, and responsiveness of the comparative example and Example 4.

FIG. 3 is a graph of the displacement amounts (here, the displacement amount pp indicates the displacement amount obtained by adding the displacement amount 0 p when the polymer actuator element illustrated in FIG. 1 is displaced from the normal condition illustrated with solid lines of FIG. 1 in the upper direction of the drawing and the displacement amount when the polymer actuator element is displaced from the normal condition in the lower direction of the drawing), the generating force, and the responsiveness of the comparative example and Example 4 presented in Table 2.

As illustrated in Table 2 and FIG. 3, the polymer actuator element of Example 4 has a greater displacement amount, a greater generating force and more excellent responsiveness, than the polymer actuator element of the comparative example. It was found that the responsiveness of Example 4 was about three times greater than that of the comparative example.

In addition, the time until the displacement amount was reduced by half by continuously applying the drive voltage of DC 2.0 V was measured. As illustrated in Table 2, the time of the reduction by half was 60 minutes or more in all the examples and the comparative example.

From the test results of Tables 1 and 2 and FIGS. 2A to 3, it was found that the polymer actuators of the examples that include both of the activated carbon nanofibers and the carbon nanohorns in the electrode layers were able to maintain the same durability as the polymer actuator element of the comparative example that included the carbon nanofiber in the electrode layer but did not include the carbon nanohorn, cause the displacement amount and the generating force to be great, and obtain excellent responsiveness compared with the comparative example.

It should be understood by those skilled in the art that various modifications, combinations, sub-combinations and alterations may occur depending on design requirements and other factors insofar as they are within the scope of the appended claims of the equivalents thereof.

TABLE 1

Appendix

| | Ionic liquid contents (mg) | Base polymer contents (BP content) (mg) | ACNF contents (mg) | CNH contents (mg) | Total carbon contents (mg) | Ionic liquid content/total carbon content | BP content/total carbon content | CNH content/total carbon content | Displacement amount (mm) | Generating force (mN) | Responsiveness (mm/sec) |
|---|---|---|---|---|---|---|---|---|---|---|---|
| Comparative Example | 249.6 | 85.2 | 53 | 0 | 53 | 4.7 | 1.6 | 0 | 0.70 | 3.00 | 0.23 |
| Example 1 | 65 | 56.8 | 25 | 25 | 50 | 1.3 | 1.1 | 0.5 | 0.80 | 6.13 | 0.33 |
| Example 2 | 83.2 | 35 | 15 | 35 | 50 | 1.7 | 0.7 | 0.7 | 0.95 | 4.90 | 0.62 |
| Example 3 | 83.2 | 56.8 | 15 | 35 | 50 | 1.7 | 1.1 | 0.7 | 0.81 | 6.37 | 0.40 |

TABLE 2

| | Driving at AC 50 mHz·2.0 V | | | | Driving at DC 2.0 V Time of DC displacement |
|---|---|---|---|---|---|
| | Displacement pp (mm) | Displacement 0 p (mm) | Generating force (mN) | Responsiveness (mm/sec) | reduction by half (mm) |
| Comparative Example | 1.39 | 0.70 | 3.0 | 0.23 | 60 or greater |
| Example 4 | 2.25 | 1.17 | 4.5 | 0.79 | 60 or greater |

What is claimed is:

1. A polymer actuator element comprising:
   an electrolyte layer; and
   an electrode layer formed on a surface of the electrolyte layer,
   wherein the electrode layer includes:
   an activated carbon nanofiber; and
   a carbon nanohorn,
   wherein a weight ratio of the carbon nanohorn in the electrode layer is greater than that of the activated carbon nanofiber.

2. The polymer actuator element according to claim 1, wherein the activated carbon nanofiber is formed from an aromatic mesophase pitch by a melt-spinning method.

3. The polymer actuator element according to claim 1, wherein the weight ratio the carbon nanohorn with respect to a total carbon content of the electrode layer is in a range of 0.5 to 0.7, exclusive of 0.5.

4. The polymer actuator element according to claim 1, wherein the electrode layer further includes ionic liquid, and a weight ratio of the ionic liquid with respect to a total carbon content in the electrode layer is in a range of 1.3 to 1.7.

5. The polymer actuator element according to claim 1, wherein the electrode layer further includes a base polymer, and a weight ratio of the base polymer with respect to a total carbon content in the electrode layer is in a range of 0.7 to 1.1.

6. The polymer actuator element according to claim 3, wherein the electrode layer further includes:
   ionic liquid having a weight ratio in a range of 1.3 to 1.7 with respect to the total carbon content in the electrode layer; and
   a base polymer having a weight ratio in a range of 0.7 to 1.1 with respect to the total carbon content in the electrode layer.

* * * * *